(12) United States Patent
Cudzik et al.

(10) Patent No.: US 11,960,798 B1
(45) Date of Patent: Apr. 16, 2024

(54) ARTIFICIAL INTELLIGENCE SYSTEMS AND METHODS FOR PROCESSING PARAMETRIC LAND PLOT DATA

(71) Applicant: OUTLINE AI Sp. z o.o., Gdańsk (PL)

(72) Inventors: Jan Paweł Cudzik, Gdańsk (PL); Paweł Krzysztof Unger, Gdańsk (PL); Alan Krzysztof Szawarski, Warsaw (PL)

(73) Assignee: OUTLINE AI Sp. z o.o., Gdansk (PL)

( * ) Notice: Subject to any disclaimer, the term of this patent is extended or adjusted under 35 U.S.C. 154(b) by 0 days.

(21) Appl. No.: 18/202,644

(22) Filed: May 26, 2023

(51) Int. Cl.
*G06F 30/13* (2020.01)
(52) U.S. Cl.
CPC ................... *G06F 30/13* (2020.01)
(58) Field of Classification Search
CPC .................................................. G06F 30/13
See application file for complete search history.

(56) References Cited

U.S. PATENT DOCUMENTS

| | | | | |
|---|---|---|---|---|
| 10,255,383 | B2* | 4/2019 | Gavini | E01C 1/02 |
| 11,308,246 | B2* | 4/2022 | Benjamin | G06T 17/10 |
| 2007/0219759 | A1* | 9/2007 | Ghazali | E04H 1/005 |
| | | | | 703/1 |
| 2018/0253510 | A1* | 9/2018 | Shen | G06F 30/13 |
| 2019/0266293 | A1* | 8/2019 | Ishida | G06T 19/00 |
| 2022/0115981 | A1* | 4/2022 | Krarti | H02S 20/23 |
| 2023/0394197 | A1* | 12/2023 | Dongjie | G06F 30/18 |

* cited by examiner

*Primary Examiner* — Brandon J Miller
(74) *Attorney, Agent, or Firm* — Outlier Patent PLLC

(57) ABSTRACT

Disclosed herein are methods and systems related for creating multi-unit structure plans. An example method may comprise obtaining land plot data and environmental data. The example method may comprise obtaining building type data. The example method may comprise obtaining legal rules and/or regulations data. The example method may comprise obtaining building demands data. The example method may comprise creating maximal volume and/or floor area. The example method may comprise creating a first line and additional lines that represent corridors/alleys thereby generating layouts based on the created maximal volume and/or floor area. The example method may comprise applying an optimizer to the generated layouts. The example method may comprise generating numeric results and/or visual representations for a multi-unit structure for a land plot associated with at least a portion of the land plot data.

20 Claims, 8 Drawing Sheets

ARTIFICIAL INTELLIGENCE SYSTEMS AND METHODS FOR PROCESSING PARAMETRIC LAND PLOT DATA

CROSS-REFERENCE TO RELATED APPLICATIONS

Background

Field of the Art

The systems and methods disclosed herein are related generally to architecture and more specifically to automating drafting of plans for multi-unit structures.

Discussion of the State of the Art

When considering purchasing a plot of land, an investor/involved party needs to consider a possible return on investment on a structure to be built or reconstructed or expanded on the plot of land. Generally, the more units a structure has, the more revenue the investor may receive. Therefore, unit placement within the structure may be important. Additionally, local laws, regulations, zoning, and/or other constraints may limit how the structure may be built. What is needed are systems and methods for automating the drafting of architectural plans for multi-unit structures with constraints considered.

SUMMARY

The present invention is for systems and methods for creating multi-unit structure plans. An example method may comprise obtaining land plot data. The example method may comprise obtaining building type data. The example method may comprise obtaining legal rules and/or regulations data. The example method may comprise obtaining building demands data. The example method may comprise creating maximal volume and/or floor area based on one or more of the obtained land plot data, obtained building type data, obtained legal rules and/or regulations data, and obtained building demands data. The example method may comprise creating a first line and additional lines that represent corridors/alleys (as used herein "corridors" may also refer to alleys, and "alleys" may also refer to corridors and generally refer to passageways or communication routes within a building among various units and/or among various buildings) thereby generating layouts based on the created maximal volume and/or floor area. The example method may comprise applying an optimizer to the generated layouts. The example method may comprise generating numeric results and/or visual representations for a multi-unit structure for a land plot associated with at least a portion of the land plot data. The system also allows for limiting the build space with the same amount of units or/and achieving among other aims such as energy efficiency, access to daylight, average amount of sun-hours, area of facades, limiting impact on the surroundings and construction spread.

Land plot data may comprise one or more of land area, plot border, frontage, offset, and barriers associated with a land plot.

Land plot data may comprise one or more of data associated with a land plot of interest, data associated with a land plot adjacent to a land plot of interest, and data associated with a land plot within a predetermined distance of a land plot of interest.

The example method may comprise creating a model of a land plot with adjacent land plots.

The example method may comprise adjusting a model of a land plot with adjacent land plots.

The building type data may comprise any structure that would be understood by a person of ordinary skill in the art, including, but not limited to, a hotel, a school, a dormitory, a hospital, an apartment building, a condominium, a private rented sector ("PRS"), a built to rent ("BTR"), a hostel, a prison, etc.

The building type data may be associated with a structure to be built on a land plot associated with at least a portion of the land plot data.

The legal rules and/or regulations data may comprise one or more of requirements regarding direct sun hours for at least a portion of windows in a building and requirements for an unobstructed view from at least a portion of windows in a building.

Building demands data may comprise one or more building requirements related to structure height, story height, floor spacing, fire hazard prevention, evacuation parameters, distances between newly created objects, minimum structure depths, minimum room depths, minimum corridor depths, maximum structure depths, maximum room depths, maximum corridor depths, minimum structure widths, minimum room widths, minimum corridor widths, maximum structure widths, maximum room widths, minimal room area, maximal room area and maximum corridor widths. It may also dement the needs of the room such as among other: particular arrangement of the unit, number of rooms in the unit, bathroom type, furniture specifics. Moreover the data may consist of environmental parameters including, but not limited to: location, sun rays, wind rose, humidity, etc. The maximal volume may be created automatically.

The maximal floor area may be created automatically.

BRIEF DESCRIPTION OF THE DRAWINGS

The accompanying drawings illustrate several embodiments and, together with the description, serve to explain the principles of the invention according to the embodiments. It will be appreciated by one skilled in the art that the particular arrangements illustrated in the drawings are merely exemplary and are not to be considered as limiting of the scope of the invention or the claims herein in any way.

DETAILED DESCRIPTION

Figure 1:
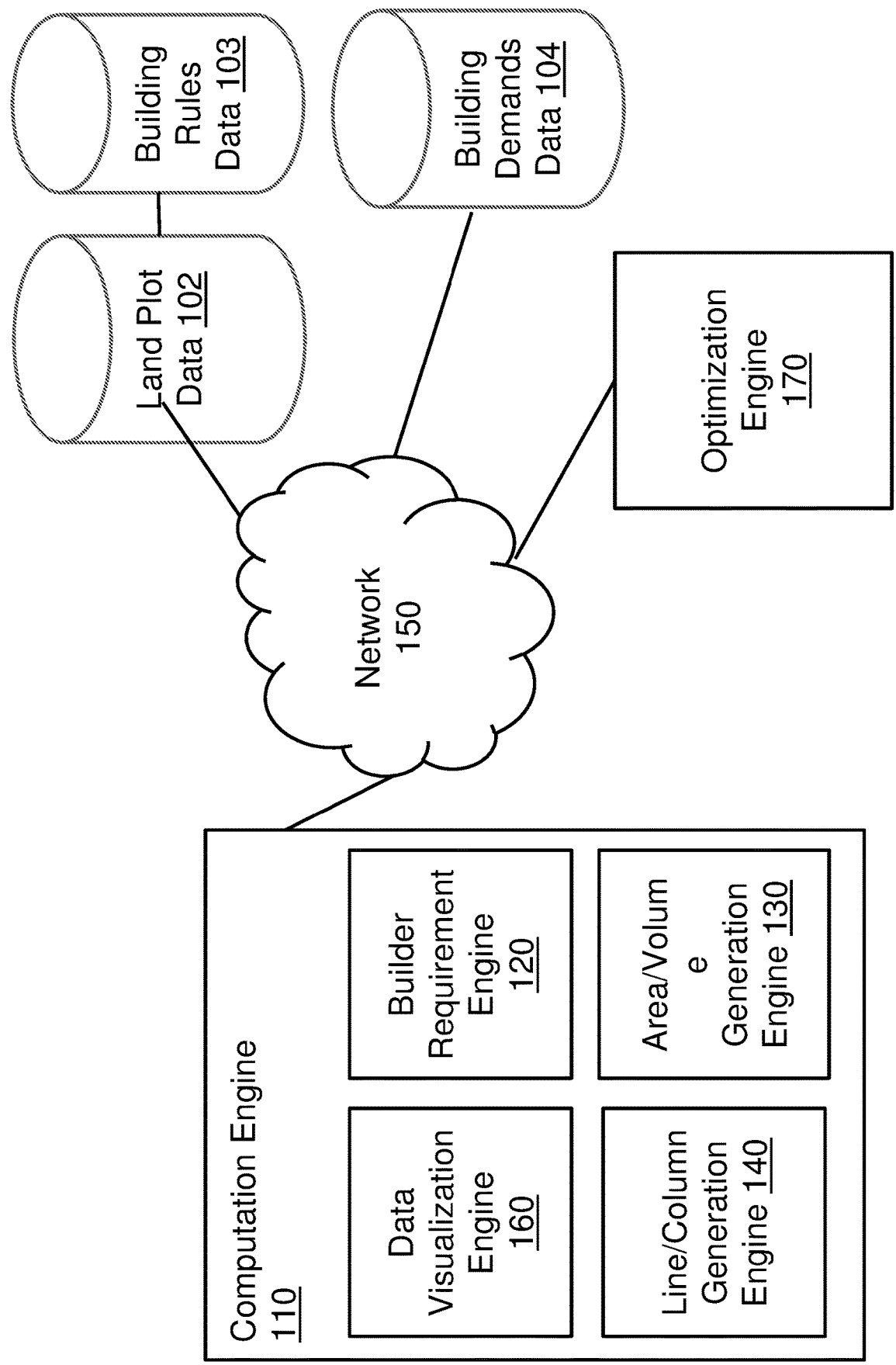
FIG. 1 illustrates a system for creating multi-unit structure plans in accordance with an exemplary embodiment of the invention.

The inventive systems and methods (hereinafter sometimes referred to more simply as "system" or "method")

described herein automate plan drafting for multi-unit structures. Specifically, the inventive systems and methods may allow a potential real estate investor to enter information about a land plot. The inventive systems and methods may use the entered information to determine a location. The inventive systems and methods may retrieve constraints (e.g., local land use laws, building rules, building demands, etc.) associated with the location. The inventive systems and methods may use the retrieved constraints to create a floor plan for a structure on the land plot with maximal floor area. The inventive systems and methods may draw lines on the floor plan representing one or more corridors. The inventive systems and methods may use the floor plan as well as structure data entered by the potential real estate investor to create multiple plans with different arrangements of rooms within the floor plan. Some or all of the created plans may be presented to the potential real estate investor as well as data about each plan (such as, for example, rentable square footage, number of rooms, etc.). The present invention may reduce time and effort needed to assess an appropriateness and/or feasibility studies associated with processing a land plot for a particular intended use.

The systems and methods described herein may cause the generation of floor plans for a structure burdened by legal regulations, such as a hotel by a computer. The computer may select a method that enables the generation of the floor plans. The computer may consider design principles, constant parameters of reconstructed objects, building regulations, etc. in making the method selection. The systems and method may select an engine that generates input data computation logic that allows for floor plan generation, which may be complicated due to complexities of design process and various possibilities of floor plans for a particular structure for a particular location from an architectural point of view. Selection of an appropriate engine in a given element is valuable in selecting a method to generate the floor plan. The systems and methods described herein may operate in a fully automatic way. The systems and methods described herein may comprise solutions that allow a user to download a complete set of data from a base model for analysis. The systems and methods described herein may eliminate a need for a specialist with knowledge in the field of architecture. The systems and methods described herein may eliminate a need for programming by a user conducting simulations. The systems and methods described herein may perform a complete set of analysis in terms of external parameters to obtain a maximum scope (e.g., volume, square footage, lot, etc.) of the floor plan in a spatial form. The systems and methods described herein account for numerous occurrences of other buildings affecting possibilities of developing free plots through their influence, such as shading, covering, fire regulations, or others.

One or more different embodiments may be described in the present application. Further, for one or more of the embodiments described herein, numerous alternative arrangements may be described; it should be appreciated that these are presented for illustrative purposes only and are not limiting of the embodiments contained herein or the claims presented herein in any way. One or more of the arrangements may be widely applicable to numerous embodiments, as may be readily apparent from the disclosure. In general, arrangements are described in sufficient detail to enable those skilled in the art to practice one or more of the embodiments, and it should be appreciated that other arrangements may be utilized and that structural, logical, software, electrical and other changes may be made without departing from the scope of the embodiments.

Particular features of one or more of the embodiments described herein may be described with reference to one or more particular embodiments or figures that form a part of the present disclosure, and in which are shown, by way of illustration, specific arrangements of one or more of the aspects. It should be appreciated, however, that such features are not limited to usage in the one or more particular embodiments or figures with reference to which they are described. The present disclosure is neither a literal description of all arrangements of one or more of the embodiments nor a listing of features of one or more of the embodiments that must be present in all arrangements.

Headings of sections provided in this patent application and the title of this patent application are for convenience only and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible embodiments and in order to more fully illustrate one or more embodiments. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the embodiments, and does not imply that the illustrated process is preferred. Also, steps are generally described once per aspect, but this does not mean they must occur once, or that they may only occur once each time a process, method, or algorithm is carried out or executed. Some steps may be omitted in some embodiments or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other embodiments need not include the device itself.

Techniques and mechanisms described or referenced herein will sometimes be described in singular form for clarity. However, it should be appreciated that particular embodiments may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various embodiments in which, for example, functions may be executed out of order from that shown or discussed, including substantially concurrently or in reverse order, depending on the functionality involved, as would be understood by those having ordinary skill in the art.

The detailed description set forth herein in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Conceptual Architecture

FIG. 1 illustrates an exemplary embodiment of a system for creating multi-unit structure plans according to one embodiment. The system comprises a computation engine 110, an optimization engine 170, a land plot data database 102, a building rules data database 103, a building demands data database 104, and a network 150 over which the various systems communicate and interact. The computation engine 110 may comprise a data visualization engine 160, a builder requirement engine 120, a line and/or column generation engine 140, and an area and/or volume generation engine 130. The various components described herein are exemplary and for illustration purposes only and any combination or subcombination of the various components may be used as would be apparent to one of ordinary skill in the art. In various embodiments, the system disclosed herein may be implemented as a standalone software executing on a computing device, as a browser plugin, as a plugin to another software, as a cloud application, etc., as would be understood by a person of ordinary skill in the art. The system may be reorganized or consolidated, as understood by a person of ordinary skill in the art, to perform the same tasks on one or more other servers or computing devices without departing from the scope of the invention.

A user device may comprise the computation engine 110. A user device may comprise the optimization engine 170. The computation engine 110 and the optimization engine 170 may be modules housed within the same user device. The computation engine 110 and the optimization engine 170 may be modules housed within different user devices. The computation engine 110 and/or the optimization engine 170 may be modules contained on a server and/or in a cloud environment and accessed via a user device over the network 150. The computation engine 110 will be described in more detail in reference to FIG. 2A. The optimization engine 170 will be described in more detail in reference to FIG. 2B.

The user device(s) may include, generally, a computer or computing device including functionality for communicating (e.g., remotely) over a network, such as the network 150. Data may be collected from user devices, and data requests may be initiated from each user device. User device(s) may be a server, a desktop computer, a laptop computer, personal digital assistant (PDA), an in- or out-of-car navigation system, a smart phone or other cellular or mobile phone, or mobile gaming device, among other suitable computing devices. User devices may execute one or more applications, such as a web browser (e.g., Microsoft Windows Internet Explorer, Mozilla Firefox, Apple Safari, Google Chrome, and Opera, etc.), or a dedicated application to submit user data, or to make prediction queries over a network 150.

In particular embodiments, each user device may be an electronic device including hardware, software, or embedded logic components or a combination of two or more such components and capable of carrying out the appropriate functions implemented or supported by the user device. For example and without limitation, a user device may be a desktop computer system, a notebook computer system, a netbook computer system, a handheld electronic device, or a mobile telephone. The present disclosure contemplates any user device. A user device may enable a network user at the user device to access network 150. A user device may enable its user to communicate with other users at other user devices.

A user device may have a web browser, such as MICROSOFT INTERNET EXPLORER, GOOGLE CHROME or MOZILLA FIREFOX, and may have one or more add-ons, plug-ins, or other extensions, such as TOOLBAR or YAHOO TOOLBAR. A user device may enable a user to enter a Uniform Resource Locator (URL) or other address directing the web browser to a server, and the web browser may generate a Hyper Text Transfer Protocol (HTTP) request and communicate the HTTP request to server. The server may accept the HTTP request and communicate to the user device one or more Hyper Text Markup Language (HTML) files responsive to the HTTP request. The user device may render a web page based on the HTML files from server for presentation to the user. The present disclosure contemplates any suitable web page files. As an example and not by way of limitation, web pages may render from HTML files, Extensible Hyper Text Markup Language (XHTML) files, or Extensible Markup Language (XML) files, according to particular needs. Such pages may also execute scripts such as, for example and without limitation, those written in JAVASCRIPT, JAVA, MICROSOFT SILVERLIGHT, combinations of markup language and scripts such as AJAX (Asynchronous JAVASCRIPT and XML), and the like. Herein, reference to a web page encompasses one or more corresponding web page files (which a browser may use to render the web page) and vice versa, where appropriate.

The user device may also include an application that is loaded onto the user device. The application obtains data from the network 150 and displays it to the user within the application interface.

Exemplary user devices are illustrated in some of the subsequent figures provided herein. This disclosure contemplates any suitable number of user devices, including computing systems taking any suitable physical form. As example and not by way of limitation, computing systems may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, or a combination of two or more of these. Where appropriate, the computing system may include one or more computer systems; be unitary or distributed; span multiple locations; span multiple machines; or reside in a cloud, which may include one or more cloud components in one or more networks. Where appropriate, one or more computing systems may perform without substantial spatial or temporal limitation one or more steps of one or more methods described or illustrated herein. As an example, and not by way of limitation, one or more computing systems may perform in real time or in batch mode one or more steps of one or more methods described or illustrated herein. One or more computing systems may perform at different times or at different locations one or more steps of one or more methods described or illustrated herein, where appropriate.

The land plot data database 102 may be hosted on one or more servers. The land plot data database 102 may be hosted on a cloud computing environment. The land plot data database 102 may associate land plots with land plot data. Land plot data may include land area, plot borders, frontage, offsets, barriers, etc. The land plot data database 102 may receive information indicative of a land plot. The land plot data database 102 may return land plot data associated with the received information indicative of the land plot.

The building rules data database 103 may be hosted on one or more servers. The building rules data database 103 may be hosted on a cloud computing environment. The building rules data database 103 may associate location and structure combinations with structure requirements. Structure requirements may include any legal and/or regulatory requirements associated with a desired structure at the desired location. For example, requirements regarding direct sun hours for at least a portion of windows in a building, requirements for an unobstructed view from at least a portion of windows in a building, etc. The building rules data database 103 may receive information indicative of a location and structure combination. The building rules data database 103 may return structure requirements associated with the received information indicative of the location and structure combination.

The building demands data database 104 may be hosted on one or more servers. The building demands data database 104 may be hosted on a cloud computing environment. The building demands data database 104 may associate structure types with structure type requirements. Structure type requirements may include any legal and/or regulatory requirements associated with a desired type of structure. For example, requirements associated with a school may include four exterior doors that automatically lock, every classroom has to have an exterior window, etc. The building demands data database 104 may receive information indicative of a structure type. The building demands data database 104 may return structure type requirements associated with the received information indicative of the structure type.

Network cloud 150 generally represents a network or collection of networks (such as the Internet or a corporate intranet, or a combination of both) over which the various components illustrated in FIG. 1 (including other components that may be necessary to execute the system described herein, as would be readily understood to a person of ordinary skill in the art). In particular embodiments, network 150 is an intranet, an extranet, a virtual private network (VPN), a local area network (LAN), a wireless LAN (WLAN), a wide area network (WAN), a metropolitan area network (MAN), a portion of the Internet, or another network 150 or a combination of two or more such networks 150. One or more links connect the systems and databases described herein to the network 150. In particular embodiments, one or more links each includes one or more wired, wireless, or optical links. In particular embodiments, one or more links each includes an intranet, an extranet, a VPN, a LAN, a WLAN, a WAN, a MAN, a portion of the Internet, or another link or a combination of two or more such links. The present disclosure contemplates any suitable network 150, and any suitable link for connecting the various systems and databases described herein.

The network 150 connects the various systems and computing devices described or referenced herein. In particular embodiments, network 150 is an intranet, an extranet, a virtual private network (VPN), a local area network (LAN), a wireless LAN (WLAN), a wide area network (WAN), a metropolitan area network (MAN), a portion of the Internet, or another network or a combination of two or more such networks 150. The present disclosure contemplates any suitable network 150.

One or more links couple one or more systems, engines or devices to the network 150. In particular embodiments, one or more links each includes one or more wired, wireless, or optical links. In particular embodiments, one or more links each includes an intranet, an extranet, a VPN, a LAN, a WLAN, a WAN, a MAN, a portion of the Internet, or another link or a combination of two or more such links. The present disclosure contemplates any suitable links coupling one or more systems, engines or devices to the network 150.

In particular embodiments, each system or engine may be a unitary server or may be a distributed server spanning multiple computers or multiple datacenters. Systems, engines, or modules may be of various types, such as, for example and without limitation, web server, news server, mail server, message server, advertising server, file server, application server, exchange server, database server, or proxy server. In particular embodiments, each system, engine or module may include hardware, software, or embedded logic components or a combination of two or more such components for carrying out the appropriate functionalities implemented or supported by their respective servers. For example, a web server is generally capable of hosting websites containing web pages or particular elements of web pages. More specifically, a web server may host HTML files or other file types, or may dynamically create or constitute files upon a request, and communicate them to client/user devices or other devices in response to HTTP or other requests from client devices or other devices. A mail server is generally capable of providing electronic mail services to various client devices or other devices. A database server is generally capable of providing an interface for managing data stored in one or more data stores.

In particular embodiments, one or more data storages may be communicatively linked to one or more servers via one or more links. In particular embodiments, data storages may be used to store various types of information. In particular embodiments, the information stored in data storages may be organized according to specific data structures. In particular embodiment, each data storage may be a relational database. Particular embodiments may provide interfaces that enable servers or clients to manage, e.g., retrieve, modify, add, or delete, the information stored in data storage.

The system may also contain other subsystems and databases, which are not illustrated in FIG. 1, but would be readily apparent to a person of ordinary skill in the art. For example, the system may include databases for storing data, storing features, storing outcomes (training sets), and storing models. Other databases and systems may be added or subtracted, as would be readily understood by a person of ordinary skill in the art, without departing from the scope of the invention.

Figure 2A:
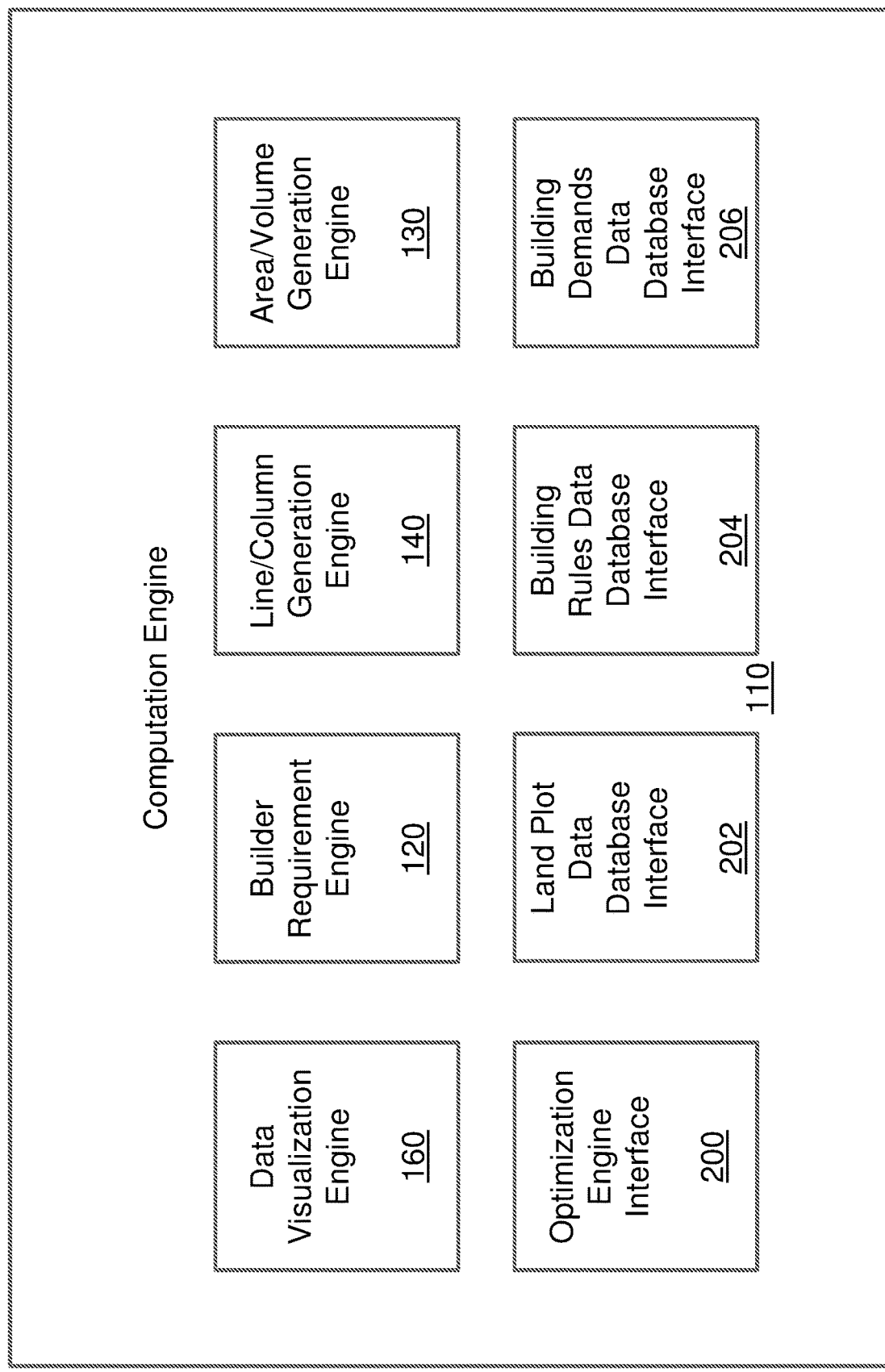
FIG. 2A illustrates a computation engine in accordance with an exemplary embodiment of the present invention.

FIG. 2A illustrates an exemplary embodiment of a computation engine 110 of FIG. 1. The exemplary computation engine 110 may determine a layout and basic features for a structure based on constraints associated with a plot of land. The exemplary computation engine 110 may comprise a data visualization engine 160, a builder requirement engine 120, a line and/or column generation engine 140, and an area and/or volume generation engine 130, an optimization engine interface 200, a land plot data database interface 202, a building rules data database interface 204, and a building demands data database interface 206. The various components described herein are exemplary and for illustration purposes only and any combination or subcombination of the various components may be used as would be apparent to one of ordinary skill in the art. Other systems, interfaces, modules, engines, databases, and the like, may be used, as would be readily understood by a person of ordinary skill in the art, without departing from the scope of the invention. Any system, interface, module, engine, database, and the like may be divided into a plurality of such elements for achieving the same function without departing from the scope of the invention. Any system, interface, module, engine, database, and the like may be combined or consolidated into fewer of such elements for achieving the same function without departing from the scope of the invention. All functions of the components discussed herein may be initiated manually or may be automatically initiated when the criteria necessary to trigger action have been met. As used below, sending or receiving data may be the same as sending or receiving one or more signals indicative of the sent or received data.

The data visualization engine 160 may create a visual representation of a plot of land of interest, including any structures (e.g., roads, buildings, etc.) or natural features (e.g., lakes, rivers, etc.) on the plot of land of interest. The data visualization engine 160 may additionally create a visual representation of adjoining plots of land to the plot of land of interest, including any objects which might obstruct a view from the plot of land of interest. The data visualization engine 160 may use information retrieved from the land plot data database 102 in FIG. 1 to make a visual representation of the plot of land of interest.

The builder requirement engine 120 may enforce constraints on layouts created by the computation engine 110. The builder requirement engine 120 may use information retrieved from the building rules data database 103 in FIG. 1 and/or the building demands data database 104 in FIG. 1 to create constraints enforced on the layouts created by the computation engine 110. The builder requirement engine 120 may use a structure type to create constraints enforced on the layouts created by the computation engine 110.

The line and/or column generation engine 140 may create corridors/alleys in plans for structures on the plot of land of interest. Corridors/alleys may connect units within a structure internally. Corridors/alleys may be non-income generating areas of a structure. The line and/or column generation engine 140 may use artificial intelligence (AI) or machine learning (ML) to learn to recognize patterns of when and where to draw corridors/alleys within layouts to increase an appeal of plots of lands. The line and/or column generation engine 140 may factor in constraints created by the builder requirement engine 120 in creating corridors/alleys.

The area and/or volume generation engine 130 may create layouts with defined boundaries. The area and/or volume generation engine 130 may use artificial intelligence (AI) or machine learning (ML) to learn to recognize patterns of when and where to create layout boundaries to increase an appeal of plots of lands. The area and/or volume generation engine 130 may factor in constraints created by the builder requirement engine 120 in creating layout boundaries.

The optimization engine interface 200 may cause information (e.g., layouts, plans, areas, volumes, corridors/alleys, etc.) created by other elements of the exemplary computation engine 110 to be transmitted to the optimization engine 170. In an exemplary embodiment, the optimization engine interface 200 may prepare the information created by other elements to be transmitted to the optimization engine 170 via the network 150. In an exemplary embodiment, the optimization engine interface 200 may prepare the information created by other elements to be transmitted to the optimization engine 170 via a bus. In an exemplary embodiment, the optimization engine interface 200 may prepare the information created by other elements to be transmitted to the optimization engine 170 via a wired communication. In an exemplary embodiment, the optimization engine interface 200 may prepare the information created by other elements to be transmitted to the optimization engine 170 via a wireless communication.

The land plot data database interface 202 may receive one or more signals indicative of data from the network 150 in FIG. 1, wherein the one or more signals originated from the land plot data database 102 in FIG. 1, and prepare the data in a manner suitable for consumption by other elements of the exemplary computation engine 110. The land plot data database interface 202 may receive one or more signals indicative of data from the other elements of the exemplary computation engine 110 and prepare the data in a manner suitable for transmission across the network 150 and ultimate consumption by the land plot data database 102. The land plot data database interface 202 may transmit Application Programming Interface (API) calls to and receive API responses from the land plot data database 102. The land plot data database interface 202 may transmit and receive Extensible Markup Language (XML) formatted messages. The land plot data database interface 202 may transmit and receive JavaScript Object Notation (JSON) formatted messages. The land plot data database interface 202 may cause information indicative of a land plot (e.g., an identifier, boundary coordinates, a street address, etc.) to be transmitted to the land plot data database 102 and corresponding land plot data (e.g., land area, plot borders, frontage, offsets, barriers, etc.) to be received from the land plot data database 102.

The building rules data database interface 204 may receive one or more signals indicative of data from the network 150 in FIG. 1, wherein the one or more signals originated from the building rules data database 103 in FIG. 1, and prepare the data in a manner suitable for consumption by other elements of the exemplary computation engine 110. The building rules data database interface 204 may receive one or more signals indicative of data from the other elements of the exemplary computation engine 110 and prepare the data in a manner suitable for transmission across the network 150 and ultimate consumption by the building rules data database 103. The building rules data database interface 204 may transmit Application Programming Interface (API) calls to and receive API responses from the building rules data database 103. The building rules data database interface 204 may transmit and receive Extensible Markup Language (XML) formatted messages. The building rules data database interface 204 may transmit and receive JavaScript Object Notation (JSON) formatted messages. The building rules data database interface 204 may cause a land plot (e.g., an identifier, boundary coordinates, a street address, etc.) and structure type (e.g., hotel, school, dormitory, hospital, apartment, condominium, hostel, prison, etc.) combination to be transmitted to the building rules data database 103 and corresponding structure requirements (e.g., requirements regarding direct sun hours for at least a portion of windows in a building, requirements for an unobstructed view from at least a portion of windows in a building, etc.) to be received from the building rules data database 103.

The building demands data database interface 206 may receive one or more signals indicative of data from the network 150 in FIG. 1, wherein the one or more signals originated from the building demands data database 104 in FIG. 1, and prepare the data in a manner suitable for consumption by other elements of the exemplary computation engine 110. The building demands data database interface 206 may receive one or more signals indicative of data from the other elements of the exemplary computation engine 110 and prepare the data in a manner suitable for transmission across the network 150 and ultimate consumption by the building demands data database 104. The building demands data database interface 206 may transmit Application Programming Interface (API) calls to and receive API responses from the building demands data database 104. The building demands data database interface 206 may transmit and receive Extensible Markup Language (XML) formatted messages. The building demands data database interface 206 may transmit and receive JavaScript Object Notation (JSON) formatted messages. The building demands data database interface 206 may cause a structure type (e.g., hotel, school, dormitory, hospital, apartment, condominium, hostel, prison, etc.) to be transmitted to the building demands data database 104 and corresponding legal and/or regulatory requirement information to be received from the building demands data database 104.

Figure 2B:
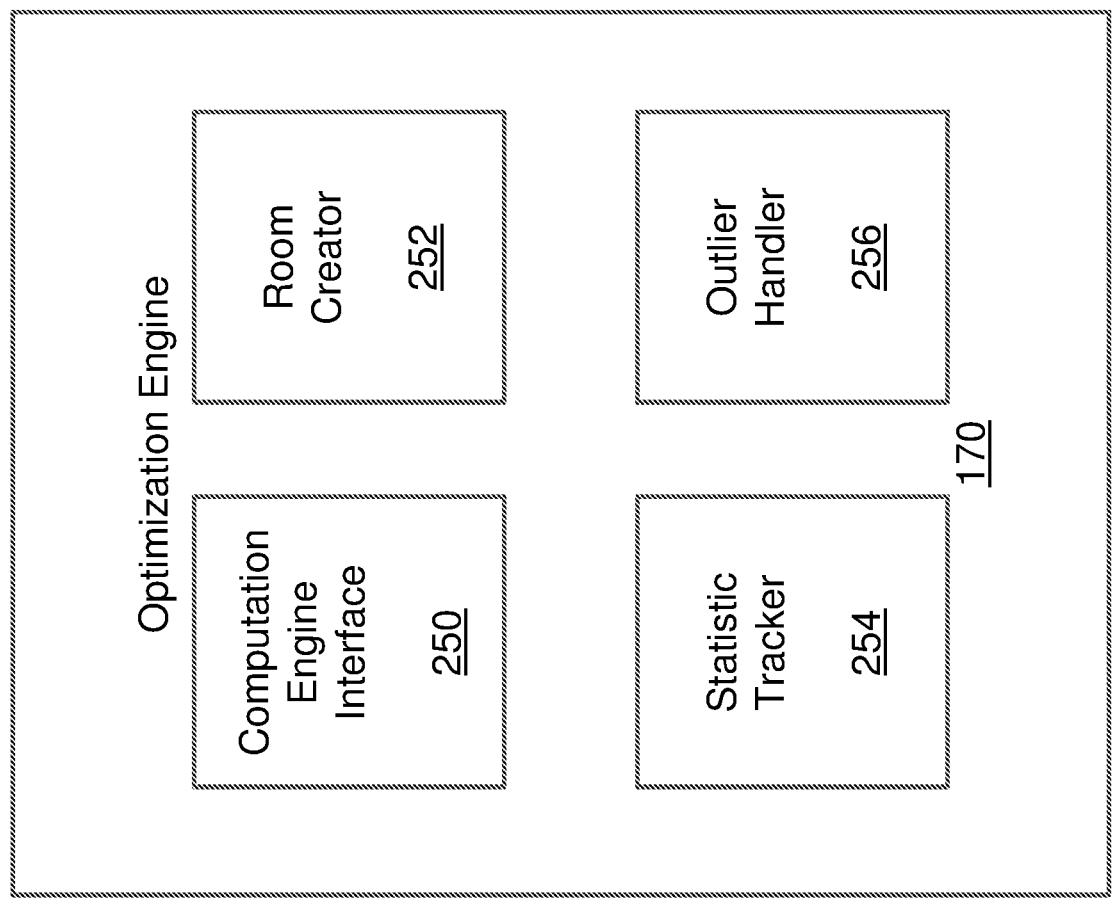
FIG. 2B illustrates an optimization engine in accordance with an exemplary embodiment of the present invention.

FIG. 2B illustrates an exemplary embodiment of an optimization engine 170 of FIG. 1. The exemplary optimization engine 170 may receive layouts created by the computation engine 110 and complete the received layouts with rooms. The exemplary optimization engine 170 may comprise a computation engine interface 250, a room creator 252, a statistic tracker 254, and an outlier handler 256. The various components described herein are exemplary and for illustration purposes only and any combination or subcombination of the various components may be used as would be apparent to one of ordinary skill in the art. Other systems, interfaces, modules, engines, databases, and the like, may be used, as would be readily understood by a person of ordinary skill in the art, without departing from the scope of the invention. Any system, interface, module, engine, database, and the like may be divided into a plurality of such elements for achieving the same function without departing from the scope of the invention. Any system, interface, module, engine, database, and the like may be combined or consolidated into fewer of such elements for achieving the same function without departing from the scope of the invention. All functions of the components discussed herein may be initiated manually or may be automatically initiated when the criteria necessary to trigger action have been met. As used below, sending or receiving data may be the same as sending or receiving one or more signals indicative of the sent or received data.

The computation engine interface 250 may receive information (e.g., layouts, plans, areas, volumes, corridors/alleys, etc.) created by the computation engine 110 and prepare the received information in a manner suitable for consumption by the other elements of the exemplary optimization engine 170. In an exemplary embodiment, the computation engine interface 250 may receive information from the computation engine 110 via the network 150. In an exemplary embodiment, the computation engine interface 250 may receive information from the computation engine 110 via a bus. In an exemplary embodiment, the computation engine interface 250 may receive information from the computation engine 110 via a wired communication. In an exemplary embodiment, the computation engine interface 250 may receive information from the computation engine 110 via a wireless communication.

The unit creator 252 may create units within layouts received from the computation engine 110 to create structure plans. The room creator 252 may use artificial intelligence (AI) or machine learning (ML) to learn to recognize patterns of when and where to place rooms within layouts to increase an appeal of plots of lands.

The statistic tracker 254 may track statistics associated with particular structure plans (e.g., floor plans, architectural plans, etc.). Tracked statistics may comprise a number of rooms, a square footage, a number of rentable rooms, a rentable square footage, etc. The tracked statistics may be presented with associated structure plans for quick analysis of each structure plan.

The outlier handler 256 may recognize when an unexpected structure plan is selected. The outlier handler 256 may receive a hand drawn structure plan when none of the structure plans created by the optimization engine 170 is selected. The outlier handler 256 may use artificial intelligence (AI) or machine learning (ML) to learn to recognize patterns of when and where unexpected structure plans may be appropriate.

Figure 3:
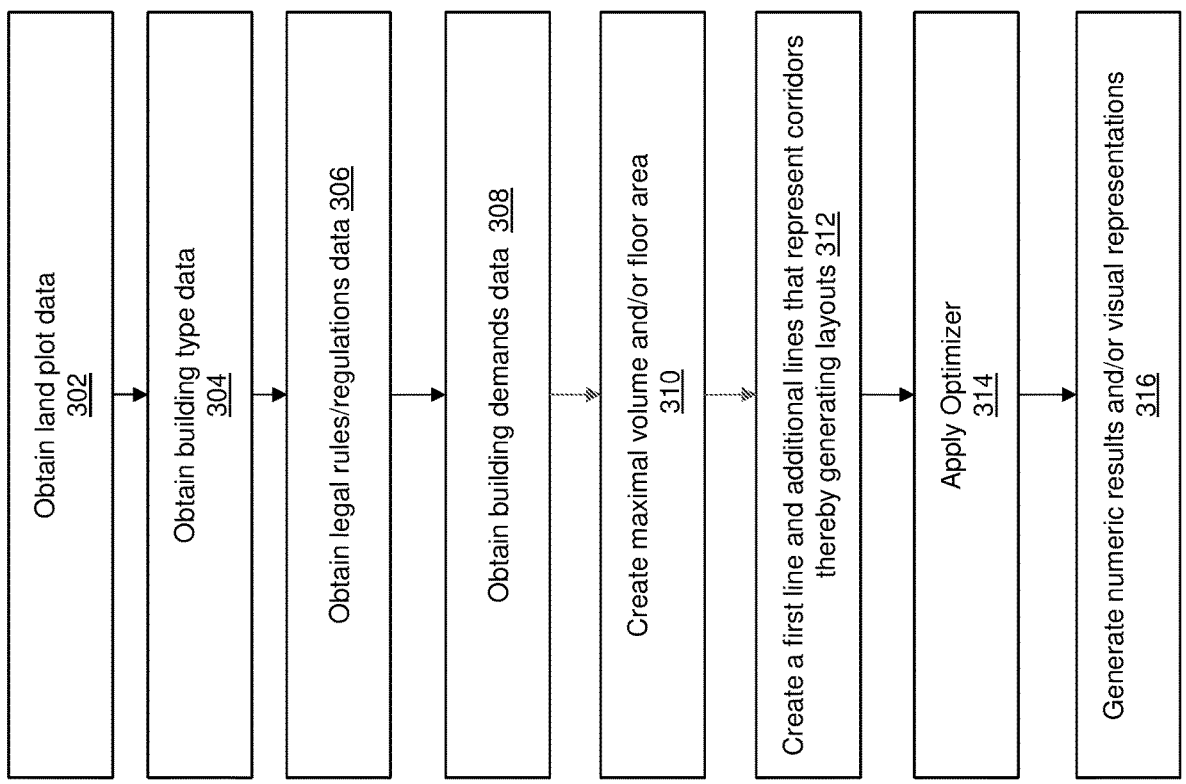
FIG. 3 illustrates an exemplary process for creating multi-unit structure plans according to one embodiment of the invention.

FIG. 3 illustrates an exemplary process for creating multi-unit structure plans according to one embodiment of the invention. In embodiments, the method steps or techniques depicted and described herein can be performed in a processor of the computation engine 110 in FIG. 1, the method steps being encoded as processor-executable instructions in a non-transitory memory of the computation engine 110. In embodiments, the method steps or techniques depicted and described herein can be performed in a processor of the optimization engine 170 in FIG. 1, the method steps being encoded as processor-executable instructions in a non-transitory memory of the optimization engine 170. The techniques of FIG. 3 may be implemented in an operating system kernel, in a separate user process, in a library package bound into network applications, on a specially constructed machine, on an application-specific integrated circuit (ASIC), or a field programmable gate array (FPGA). The process may comprise additional steps, fewer steps, and/or a different order of steps without departing from the scope of the invention as would be apparent to one of ordinary skill in the art.

At step 302, land plot data may be obtained. Land plot data may comprise one or more of land area, plot border, frontage, offset, and barriers associated with a land plot. Land plot data may comprise one or more of data associated with a land plot of interest, data associated with a land plot adjacent to a land plot of interest, and data associated with a land plot within a predetermined distance of a land plot of interest.

At step 304, building type data may be obtained. The building type data may comprise one or more of a hotel, a school, a dormitory, a hospital, an apartment, a condominium, a hostel, and a prison. A unit may be one or more of a hotel room, a classroom, a dormitory room, an examination room, an apartment unit, a condominium unit, a hostel room, parking lot, warehouse, warehouse shelving, and a prison cell. The building type data may be associated with a structure to be built on a land plot associated with at least a portion of the land plot data.

At step 306, legal rules and/or regulations data may be obtained. The legal rules and/or regulations data may comprise one or more of requirements regarding direct sun hours for at least a portion of windows in a building and requirements for an unobstructed view from at least a portion of windows in a building. For example, windows of a structure may need to allow a certain amount of natural sunlight in during particular hours.

At step 308, building demands data may be obtained. Building demands data may comprise one or more building requirements related to structure height, story height, floor spacing, fire hazard prevention, evacuation parameters, distances between newly created objects, minimum structure depths, minimum room depths, minimum corridor depths, maximum structure depths, maximum room depths, maximum corridor depths, minimum structure widths, minimum room widths, minimum corridor widths, maximum structure widths, maximum room widths, and maximum corridor widths.

Optionally, environmental data (e.g., environmental parameters, etc.) may be obtained. The environmental data may allow for analysis of access to daylight for a user. The environmental data may allow for calculation of a number of sun hours for a user. The number of sun hours may be relevant to legal regulations in particular jurisdictions (e.g., states, countries, cities, etc.). The number of sun hours may influence living comfort.

The environmental data may contain weather data used for running energy usage simulations. Environmental data may comprise basic location information, such as longitude, latitude, time zone, elevation, annual design conditions, monthly average ground temperatures, typical and extreme periods, holidays/daylight saving periods, and data periods. Environmental data may allow for diverse simulations regarding comfort and facilitating legal compliance. Example simulations may make predictions such as the sun's path, estimating (e.g., calculating, counting, etc.) of sun hours on the facade and/or floor of an apartment, and/or any other desired parameters.

At step 310, maximal volume and/or floor area may be created based on one or more of the obtained land plot data, obtained building type data, obtained legal rules and/or regulations data, and obtained building demands data. The maximal volume may be created automatically. The maximal floor area may be created automatically.

At step 312, a first line and additional lines that represent corridors/alleys may be created thereby generating layouts based on the created maximal volume and/or floor area. Corridors/alleys may be halls that connect rooms within a structure internally. Corridors/alleys may be non-income generating portions of a structure.

At step 314, an optimizer may be applied to the generated layouts. The optimizer may create rooms within the generated layouts and connected to at least one corridor. A number of rooms created may be based on obtained constraints, such as, for example, a user preference for room depth, a legal requirement for a room square footage, etc.

At step 316, numeric results and/or visual representations for a multi-unit structure for a land plot associated with at least a portion of the land plot data may be generated. The visual representations may comprise floor plans for multi-unit structures. The visual representations may comprise architectural plans for multi-unit structures. The visual representations may comprise three dimensional models for multi-unit structures. Each numeric result may be associated with a visual representation. Each numeric result may comprise easily viewable statistics associated with an associated visual representation. Each numeric result may comprise, for example, total number of rentable rooms, total number of rentable square footage, etc. associated with an associated visual representation. The numeric results and/or visual representations may be outputted to a screen. The numeric results and/or visual representations may be transmitted to a client device for output to a screen of the client device.

A model of a land plot with adjacent land plots may be created. A model of a land plot with adjacent land plots may be adjusted.

A real estate investment group may be considering purchasing a plot of land for an apartment building. The real estate investment group may decide the apartment building needs to generate $450,000 per month to be a worthwhile investment. The real estate investment group may enter the plot of land into a computing device comprising the computation engine 110 in FIG. 1 and the optimization engine 170 in FIG. 1. The real estate investment group may input into the computation engine 110 that each unit must be at least 1200 sqft. and comprise at least two bedrooms that are each at least 10 ft. wide and at least 10 ft. deep. The computation engine 110 may use the entered plot of land to retrieve data about the plot of land from the land plot data database 102 in FIG. 1, the building rules data database 103 in FIG. 1, and the building demands data database 104 in FIG. 1 via the network 150 in FIG. 1. The computation engine 110 may use the retrieved data about the plot of land to determine that any structure built on the plot of land cannot exceed three stories. The computation engine 110 may create layouts for a structure to be built on the plot of land. The optimization engine 170 may add rooms to the created layouts to create plans for a structure to be built on the plot of land. The optimization engine 170 may track statistics, such as rentable units, rentable square footage, etc. associated with each plan. The created plans and tracked statistics may be presented to members of the real estate investment group for easy digestion of possible plans and assessment of if $450,000 per month in rents is attainable.

Hardware Architecture

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit (ASIC), or on a network interface card.

Software/hardware hybrid implementations of at least some of the embodiments disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be described herein in order to illustrate one or more exemplary means by which a given unit of functionality may be implemented. According to specific embodiments, at least some of the features or functionalities of the various embodiments disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, or other appropriate computing device), a consumer electronic device, a music player, or any other suitable electronic device, router, switch, or other suitable device, or any combination thereof. In at least some embodiments, at least some of the features or functionalities of the various embodiments disclosed herein may be implemented in one or more virtualized computing environments (e.g., network computing clouds, virtual machines hosted on one or more physical computing machines, or other appropriate virtual environments).

Any of the above mentioned systems, units, modules, engines, controllers, interfaces, components or the like may be and/or comprise hardware and/or software as described herein. For example, the computation engine 110, the optimization engine 170, and subcomponents thereof may be and/or comprise computing hardware and/or software as described herein in association with FIGS. 4-7. Furthermore, any of the above mentioned systems, units, modules, engines, controllers, interfaces, components or the like may use and/or comprise an application programming interface (API) for communicating with other systems units, modules, engines, controllers, interfaces, components, or the like for obtaining and/or providing data or information.

Figure 4:
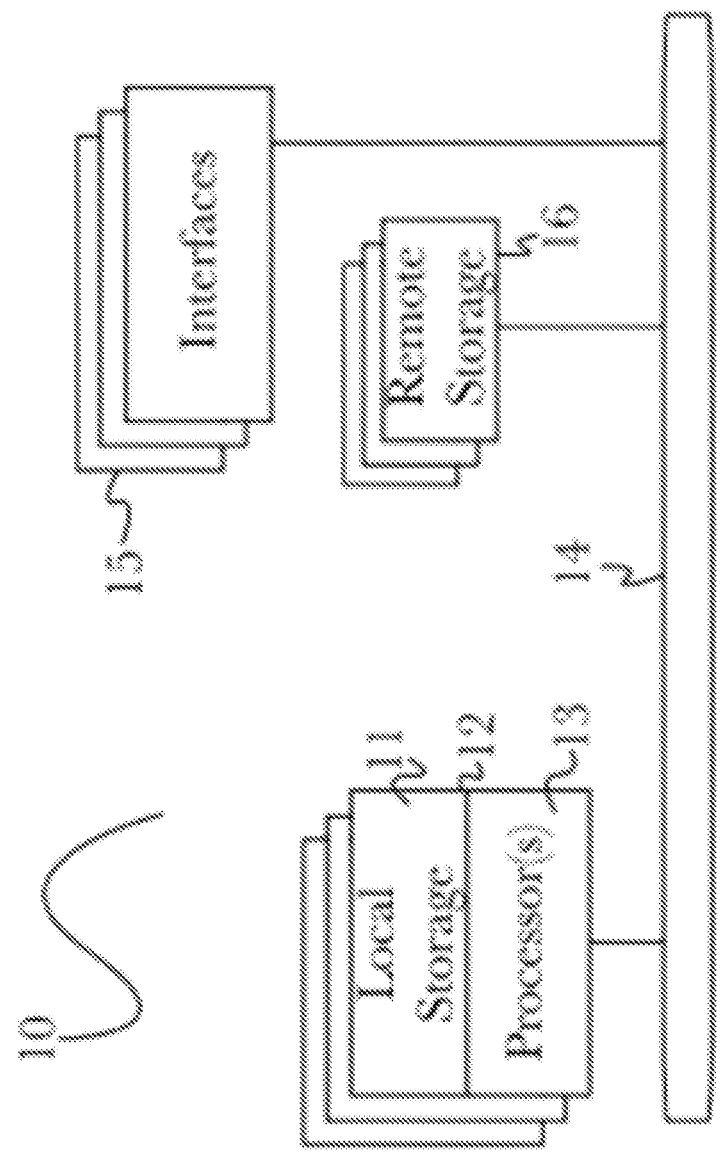
FIG. 4 illustrates one embodiment of the computing architecture that supports an embodiment of the inventive disclosure.

Referring now to FIG. 4, there is shown a block diagram depicting an exemplary computing device 10 suitable for implementing at least a portion of the features or functionalities disclosed herein. Computing device 10 may be, for example, any one of the computing machines listed in the previous paragraph, or indeed any other electronic device capable of executing software- or hardware-based instructions according to one or more programs stored in memory. Computing device 10 may be configured to communicate with a plurality of other computing devices, such as clients or servers, over communications networks such as a wide area network a metropolitan area network, a local area network, a wireless network, the Internet, or any other network, using known protocols for such communication, whether wireless or wired.

In one aspect, computing device 10 includes one or more central processing units (CPU) 12, one or more interfaces 15, and one or more busses 14 (such as a peripheral component interconnect (PCI) bus). When acting under the control of appropriate software or firmware, CPU 12 may be responsible for implementing specific functions associated with the functions of a specifically configured computing device or machine. For example, in at least one aspect, a computing device 10 may be configured or designed to function as a server system utilizing CPU 12, local memory 11 and/or remote memory 16, and interface(s) 15. In at least one aspect, CPU 12 may be caused to perform one or more of the different types of functions and/or operations under the control of software modules or components, which for example, may include an operating system and any appropriate applications software, drivers, and the like.

CPU 12 may include one or more processors 13 such as, for example, a processor from one of the Intel, ARM, Qualcomm, and AMD families of microprocessors. In some embodiments, processors 13 may include specially designed hardware such as application-specific integrated circuits (ASICs), electrically erasable programmable read-only memories (EEPROMs), field-programmable gate arrays (FPGAs), and so forth, for controlling operations of computing device 10. In a particular aspect, a local memory 11 (such as non-volatile random-access memory (RAM) and/or read-only memory (ROM), including for example one or more levels of cached memory) may also form part of CPU 12. However, there are many different ways in which memory may be coupled to system 10. Memory 11 may be used for a variety of purposes such as, for example, caching and/or storing data, programming instructions, and the like. It should be further appreciated that CPU 12 may be one of a variety of system-on-a-chip (SOC) type hardware that may include additional hardware such as memory or graphics processing chips, such as a QUALCOMM SNAPDRAGON™ or SAMSUNG EXYNOS™ CPU as are becoming increasingly common in the art, such as for use in mobile devices or integrated devices.

As used herein, the term "processor" is not limited merely to those integrated circuits referred to in the art as a processor, a mobile processor, or a microprocessor, but broadly refers to a microcontroller, a microcomputer, a programmable logic controller, an application-specific integrated circuit, and any other programmable circuit.

In one aspect, interfaces 15 are provided as network interface cards (NICs). Generally, NICs control the sending and receiving of data packets over a computer network; other types of interfaces 15 may for example support other peripherals used with computing device 10. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, FIREWIRE™ THUNDERBOLT™, PCI, parallel, radio frequency (RF), BLUETOOTH™, near-field communications (e.g., using near-field magnetics), 802.11 (WiFi), frame relay, TCP/IP, ISDN, fast Ethernet interfaces, Gigabit Ethernet interfaces, Serial ATA (SATA) or external SATA (ESATA) interfaces, high-definition multimedia interface (HDMI), digital visual interface (DVI), analog or digital audio interfaces, asynchronous transfer mode (ATM) interfaces, high-speed serial interface (HSSI) interfaces, Point of Sale (POS) interfaces, fiber data distributed interfaces (FDDIs), and the like. Generally, such interfaces 15 may include physical ports appropriate for communication with appropriate media. In some cases, they may also include an independent processor (such as a dedicated audio or video processor, as is common in the art for high-fidelity A/V hardware interfaces) and, in some instances, volatile and/or non-volatile memory (e.g., RAM).

Although the system shown in FIG. 4 illustrates one specific architecture for a computing device 10 for implementing one or more of the embodiments described herein, it is by no means the only device architecture on which at least a portion of the features and techniques described herein may be implemented. For example, architectures having one or any number of processors 13 may be used, and such processors 13 may be present in a single device or distributed among any number of devices. In one aspect, single processor 13 handles communications as well as routing computations, while in other embodiments a separate dedicated communications processor may be provided. In various embodiments, different types of features or functionalities may be implemented in a system according to the aspect that includes a client device (such as a tablet device or smartphone running client software) and server systems (such as a server system described in more detail below).

Regardless of network device configuration, the system of an aspect may employ one or more memories or memory modules (such as, for example, remote memory block 16 and local memory 11) configured to store data, program instructions for the general-purpose network operations, or other information relating to the functionality of the embodiments described herein (or any combinations of the above). Program instructions may control execution of or comprise an operating system and/or one or more applications, for example. Memory 16 or memories 11, 16 may also be configured to store data structures, configuration data, encryption data, historical system operations information, or any other specific or generic non-program information described herein.

Because such information and program instructions may be employed to implement one or more systems or methods described herein, at least some network device embodiments may include nontransitory machine-readable storage media, which, for example, may be configured or designed to store program instructions, state information, and the like for performing various operations described herein. Examples of such nontransitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory (as is common in mobile devices and integrated systems), solid state drives (SSD) and "hybrid SSD" storage drives that may combine physical components of solid state and hard disk drives in a single hardware device (as are becoming increasingly common in the art with regard to personal computers), memristor memory, random access memory (RAM), and the like. It should be appreciated that such storage means may be integral and non-removable (such as RAM hardware modules that may be soldered onto a motherboard or otherwise integrated into an electronic device), or they may be removable such as swappable flash memory modules (such as "thumb drives" or other removable media designed for rapidly exchanging physical storage devices), "hot-swappable" hard disk drives or solid state drives, removable optical storage discs, or other such removable media, and that such integral and removable storage media may be utilized interchangeably. Examples of program instructions include both object code, such as may be produced by a compiler, machine code, such as may be produced by an assembler or a linker, byte code, such as may be generated by for example a JAVA™ compiler and may be executed using a Java virtual machine or equivalent, or files containing higher level code that may be executed by the computer using an interpreter (for example, scripts written in Python, Perl, Ruby, Groovy, or any other scripting language).

Figure 5:
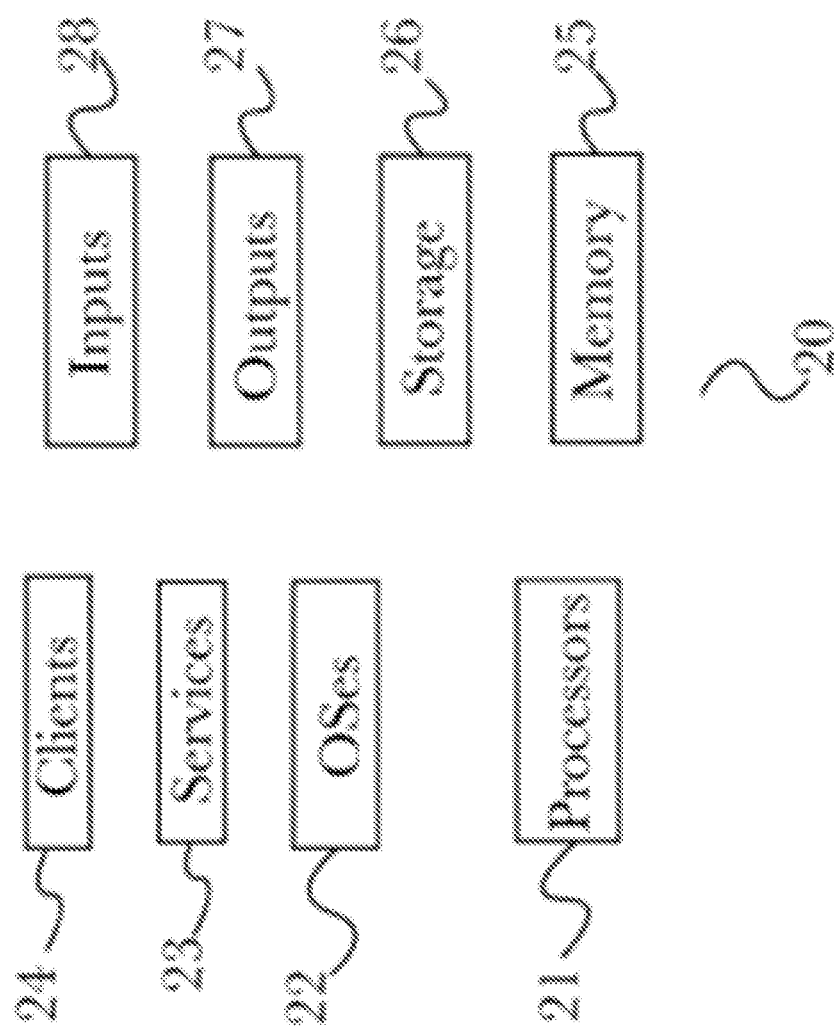
FIG. 5 illustrates components of a system architecture that supports an embodiment of the inventive disclosure.

In some embodiments, systems may be implemented on a standalone computing system. Referring now to FIG. 5, there is shown a block diagram depicting a typical exemplary architecture of one or more embodiments or components thereof on a standalone computing system. Computing device 20 includes processors 21 that may run software that carry out one or more functions or applications of embodiments, such as for example a client application. Processors 21 may carry out computing instructions under control of an operating system 22 such as, for example, a version of MICROSOFT WINDOWS™ operating system, APPLE macOS™ or iOS™ operating systems, some variety of the Linux operating system, ANDROID™ operating system, or the like. In many cases, one or more shared services 23 may be operable in system 20, and may be useful for providing common services to client applications. Services 23 may for example be WINDOWS™ services, user-space common services in a Linux environment, or any other type of common service architecture used with operating system 21. Input devices 28 may be of any type suitable for receiving user input, including for example a keyboard, touchscreen, microphone (for example, for voice input), mouse, touchpad, trackball, or any combination thereof. Output devices 27 may be of any type suitable for providing output to one or more users, whether remote or local to system 20, and may include for example one or more screens for visual output, speakers, printers, or any combination thereof. Memory 25 may be random-access memory having any structure and architecture known in the art, for use by processors 21, for example to run software. Storage devices 26 may be any magnetic, optical, mechanical, memristor, or electrical storage device for storage of data in digital form (such as those described above, referring to FIG. 4). Examples of storage devices 26 include flash memory, magnetic hard drive, CD-ROM, and/or the like.

Figure 6:
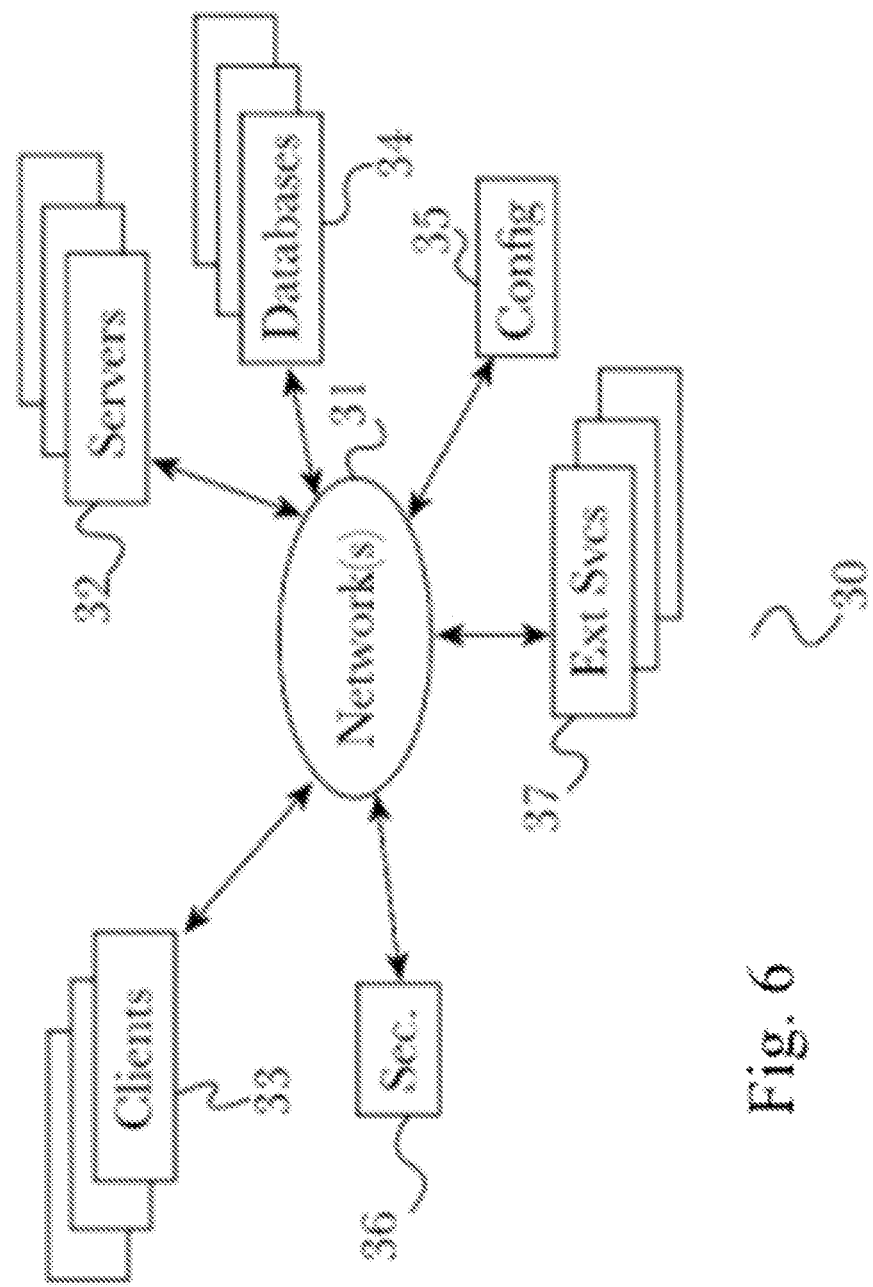
FIG. 6 illustrates components of a computing device that supports an embodiment of the inventive disclosure.

In some embodiments, systems may be implemented on a distributed computing network, such as one having any number of clients and/or servers. Referring now to FIG. 6, there is shown a block diagram depicting an exemplary architecture 30 for implementing at least a portion of a system according to one aspect on a distributed computing network. According to the aspect, any number of clients 33 may be provided. Each client 33 may run software for implementing client-side portions of a system; clients may comprise a system 20 such as that illustrated in FIG. 5. In addition, any number of servers 32 may be provided for handling requests received from one or more clients 33. Clients 33 and servers 32 may communicate with one another via one or more electronic networks 31, which may be in various embodiments any of the Internet, a wide area network, a mobile telephony network (such as CDMA or GSM cellular networks), a wireless network (such as WiFi, WiMAX, LTE, and so forth), or a local area network (or indeed any network topology known in the art; the aspect does not prefer any one network topology over any other). Networks 31 may be implemented using any known network protocols, including for example wired and/or wireless protocols.

In addition, in some embodiments, servers 32 may call external services 37 when needed to obtain additional information, or to refer to additional data concerning a particular call. Communications with external services 37 may take place, for example, via one or more networks 31. In various embodiments, external services 37 may comprise web-enabled services or functionality related to or installed on the hardware device itself. For example, in one aspect where client applications are implemented on a smartphone or other electronic device, client applications may obtain information stored in a server system 32 in the cloud or on an external service 37 deployed on one or more of a particular enterprise's or user's premises.

In some embodiments, clients 33 or servers 32 (or both) may make use of one or more specialized services or appliances that may be deployed locally or remotely across one or more networks 31. For example, one or more databases 34 may be used or referred to by one or more embodiments. It should be understood by one having ordinary skill in the art that databases 34 may be arranged in a wide variety of architectures and using a wide variety of data access and manipulation means. For example, in various embodiments one or more databases 34 may comprise a relational database system using a structured query language (SQL), while others may comprise an alternative data storage technology such as those referred to in the art as "NoSQL" (for example, HADOOP CASSANDRA™, GOOGLE BIGTABLE™, and so forth). In some embodiments, variant database architectures such as column-oriented databases, in-memory databases, clustered databases, distributed databases, or even flat file data repositories may be used according to the aspect. It will be appreciated by one having ordinary skill in the art that any combination of known or future database technologies may be used as appropriate, unless a specific database technology or a specific arrangement of components is specified for a particular aspect described herein. Moreover, it should be appreciated that the term "database" as used herein may refer to a physical database machine, a cluster of machines acting as a single database system, or a logical database within an overall database management system. Unless a specific meaning is specified for a given use of the term "database", it should be construed to mean any of these senses of the word, all of which are understood as a plain meaning of the term "database" by those having ordinary skill in the art.

Similarly, some embodiments may make use of one or more security systems 36 and configuration systems 35. Security and configuration management are common information technology (IT) and web functions, and some amount of each are generally associated with any IT or web systems. It should be understood by one having ordinary skill in the art that any configuration or security subsystems known in the art now or in the future may be used in conjunction with embodiments without limitation, unless a specific security 36 or configuration system 35 or approach is specifically required by the description of any specific aspect.

Figure 7:
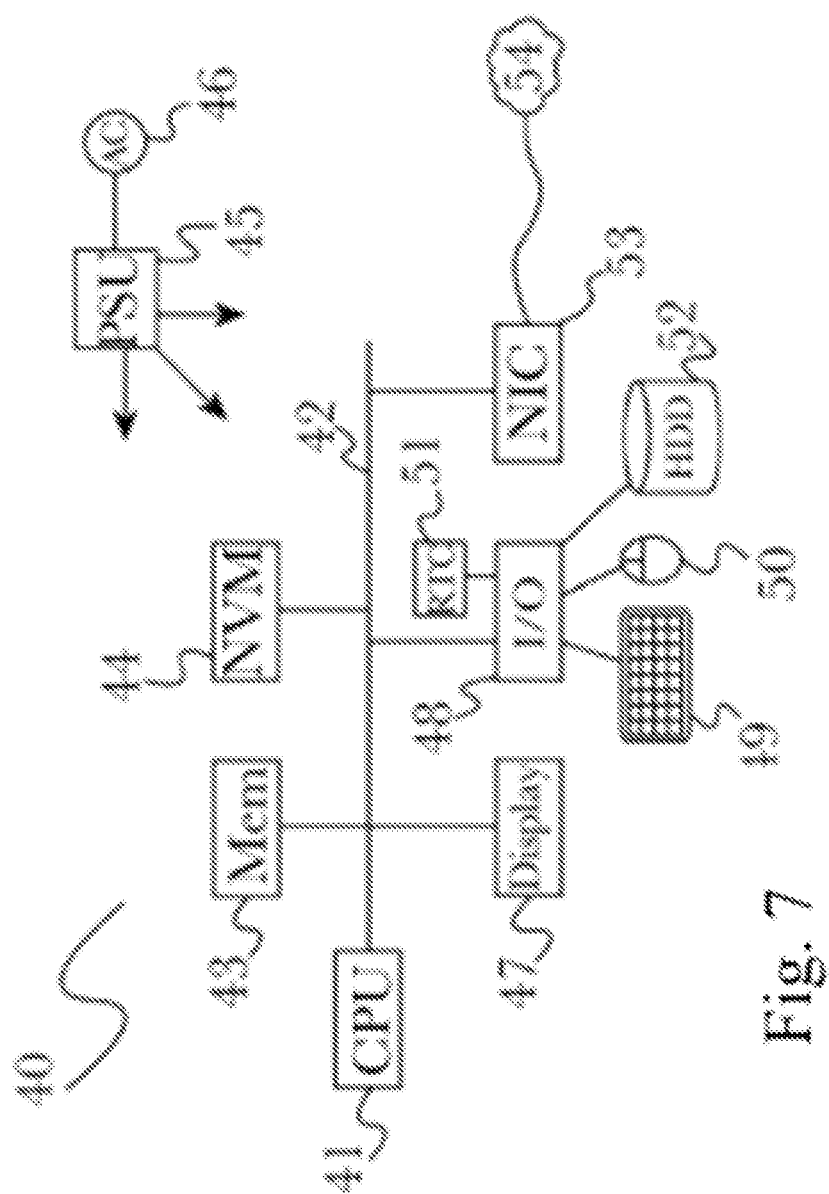
FIG. 7 illustrates components of a computing device that supports an embodiment of the inventive disclosure.

FIG. 7 shows an exemplary overview of a computer system 40 as may be used in any of the various locations throughout the system. It is exemplary of any computer that may execute code to process data. Various modifications and changes may be made to computer system 40 without departing from the broader scope of the system and method disclosed herein. Central processor unit (CPU) 41 is connected to bus 42, to which bus is also connected memory 43, nonvolatile memory 44, display 47, input/output (I/O) unit 48, and network interface card (NIC) 53. I/O unit 48 may, typically, be connected to keyboard 49, pointing device 50, hard disk 52, and real-time clock 51. NIC 53 connects to network 54, which may be the Internet or a local network, which local network may or may not have connections to the Internet. Also shown as part of system 40 is power supply unit 45 connected, in this example, to a main alternating current (AC) supply 46. Not shown are batteries that could be present, and many other devices and modifications that are well known but are not applicable to the specific novel functions of the current system and method disclosed herein. It should be appreciated that some or all components illustrated may be combined, such as in various integrated applications, for example Qualcomm or Samsung system-on-a-chip (SOC) devices, or whenever it may be appropriate to combine multiple capabilities or functions into a single hardware device (for instance, in mobile devices such as smartphones, video game consoles, in-vehicle computer systems such as navigation or multimedia systems in automobiles, or other integrated hardware devices).

In various embodiments, functionality for implementing systems or methods of various embodiments may be distributed among any number of client and/or server components. For example, various software modules may be implemented for performing various functions in connection with the system of any particular aspect, and such modules may be variously implemented to run on server and/or client components.

The skilled person will be aware of a range of possible modifications of the various embodiments described above. Accordingly, the present invention is defined by the claims and their equivalents.

Additional Considerations

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for creating multi-unit structure plans through the disclosed principles herein. Thus, while particular embodiments and applications have been illustrated and described, it is to be understood that the disclosed embodiments are not limited to the precise construction and components disclosed herein. Various apparent modifications, changes and variations may be made in the arrangement, operation and details of the method and apparatus disclosed herein without departing from the spirit and scope defined in the appended claims.

What is claimed is:

1. A computer implemented method for creating multi-unit land use and structure plans comprising:
   obtaining first electronic data comprising land plot data;
   obtaining second electronic data comprising building type data;
   obtaining third electronic data comprising legal rules and/or regulations data;
   obtaining fourth electronic data comprising building demands data;
   obtaining fifth electronic data comprising environmental data;
   creating maximal volume and/or floor area and/or land area based on one or more of the obtained first electronic data, second electronic data, third electronic data, fourth electronic data, and fifth electronic data;

creating a first line and additional lines that represent corridors thereby generating layouts based on the created maximal volume and/or floor area and/or land area;

applying an optimizer to the generated layouts; and generating numeric results and/or visual representations for a multi-unit structure for a land plot associated with the first electronic data, wherein the numeric results and/or visual representations are generated based on a combination of the first electronic data with at least one of the second electronic data, third electronic data, fourth electronic data, and fifth electronic data.

2. The method of claim 1, wherein land plot data comprise one or more of land area, plot border, frontage, offset, and barriers associated with a land plot.

3. The method of claim 1, wherein land plot data comprise one or more of data associated with a land plot of interest, data associated with a land plot adjacent to a land plot of interest, and data associated with a land plot within a predetermined distance of a land plot of interest.

4. The method of claim 1, further comprising creating a model of a land plot with adjacent land plots.

5. The method of claim 1, further comprising adjusting a model of a land plot with adjacent land plots.

6. The method of claim 1, wherein the building type data comprise one or more of a hotel, a school, a dormitory, a hospital, an apartment building, a condominium, a private rented sector construction, a built-to-rent building, a hostel, a parking lot, and a prison.

7. The method of claim 1, wherein the building type data is associated with a structure to be built on a land plot associated with at least a portion of the land plot data.

8. The method of claim 1, wherein the legal rules and/or regulations data comprise one or more of requirements regarding direct sun hours for at least a portion of windows in a building and requirements for an unobstructed view from at least a portion of windows in a building.

9. The method of claim 1, wherein building demands data comprise one or more building requirements related to structure height, story height, floor spacing, fire hazard prevention, evacuation parameters, distances between newly created objects, minimum structure depths, minimum room depths, minimum corridor depths, maximum structure depths, maximum room depths, maximum corridor depths, minimum structure widths, minimum room widths, minimum corridor widths, maximum structure widths, maximum room widths, and maximum corridor widths.

10. The method of claim 1, wherein the maximal volume is created automatically.

11. The method of claim 1, wherein the maximal floor area is created automatically.

12. A system for creating multi-unit structure plans comprising:

a computing device processor; and a memory device including instructions that, when executed by the computing device processor, enables the computing system to:

obtain first electronic data comprising land plot data;

obtain second electronic data comprising building type data;

obtain third electronic data comprising legal rules and/or regulations data;

obtain fourth electronic data comprising building demands data;

obtain fifth electronic data comprising environmental data;

create maximal volume and/or floor area based on one or more of the obtained first electronic data, second electronic data, third electronic data, fourth electronic data, and fifth electronic data;

create a first line and additional lines that represent corridors thereby generating layouts based on the created maximal volume and/or floor area;

apply an optimizer to the generated layouts; and generate numeric results and/or visual representations for a multi-unit structure for a land plot associated with the first electronic data, wherein the numeric results and/or visual representations are generated based on a combination of the first electronic data with at least one of the second electronic data, third electronic data, fourth electronic data, and fifth electronic data.

13. The system of claim 12, wherein land plot data comprise one or more of land area, plot border, frontage, offset, and barriers associated with a land plot.

14. The system of claim 12, wherein land plot data comprise one or more of data associated with a land plot of interest, data associated with a land plot adjacent to a land plot of interest, and data associated with a land plot within a predetermined distance of a land plot of interest.

15. The system of claim 12, wherein the memory device further includes instructions that, when executed by the computing device processor, enables the computing system to create a model of a land plot with adjacent land plots.

16. The system of claim 12, wherein the memory device further includes instructions that, when executed by the computing device processor, enables the computing system to adjust a model of a land plot with adjacent land plots.

17. The system of claim 12, wherein the building type data comprise one or more of a hotel, a school, a dormitory, a hospital, an apartment, a condominium, a hostel, and a prison.

18. The system of claim 12, wherein the building type data is associated with a structure to be built on a land plot associated with at least a portion of the land plot data.

19. The system of claim 12, wherein the legal rules and/or regulations data comprise one or more of requirements regarding direct sun hours for at least a portion of windows in a building and requirements for an unobstructed view from at least a portion of windows in a building.

20. The system of claim 12, wherein building demands data comprise one or more building requirements related to structure height, story height, floor spacing, fire hazard prevention, evacuation parameters, distances between newly created objects, minimum structure depths, minimum room depths, minimum corridor depths, maximum structure depths, maximum room depths, maximum corridor depths, minimum structure widths, minimum room widths, minimum corridor widths, maximum structure widths, maximum room widths, and maximum corridor widths.

* * * * *